US010108097B2

(12) United States Patent
Schoenhoff et al.

(10) Patent No.: US 10,108,097 B2
(45) Date of Patent: Oct. 23, 2018

(54) ARRANGEMENT FOR MANIPULATING THE POSITION OF AN ELEMENT

(71) Applicant: Carl Zeiss SMT GmbH, Oberkochen (DE)

(72) Inventors: Ulrich Schoenhoff, Neu-Ulm (DE); Eylem Bektas, Aalen (DE); Markus Hauf, Ulm (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/647,702

(22) Filed: Jul. 12, 2017

(65) Prior Publication Data
US 2017/0329238 A1    Nov. 16, 2017

Related U.S. Application Data

(63) Continuation of application No. PCT/EP2016/051027, filed on Jan. 19, 2016.

(30) Foreign Application Priority Data

Feb. 3, 2015    (DE) .................. 10 2015 201 870

(51) Int. Cl.
 G03B 27/54    (2006.01)
 G03F 7/20     (2006.01)
 G02B 7/02     (2006.01)

(52) U.S. Cl.
 CPC ......... G03F 7/70775 (2013.01); G02B 7/023 (2013.01); G03F 7/70825 (2013.01)

(58) Field of Classification Search
 CPC .................. G03F 7/70766; G03F 7/70775
 (Continued)

(56) References Cited

U.S. PATENT DOCUMENTS 6,788,386 B2    9/2004  Cox et al.
8,908,146 B2 *  12/2014 Butler ................. G03F 7/70766
                                                        355/30
(Continued)

FOREIGN PATENT DOCUMENTS

DE   10 2008 009 600 A1   8/2009
EP        1513018 A1      3/2005
(Continued)

OTHER PUBLICATIONS

German Office Action, with translation thereof, for corresponding Appl No. 10 2015 201 870.9, dated Dec. 23, 2015.
(Continued)

Primary Examiner — Hung Henry Nguyen
(74) Attorney, Agent, or Firm — Fish & Richardson P.C.

(57) ABSTRACT

The disclosure relates to arrangements for manipulating the position of an element. An arrangement according has at least one actuator for each degree of freedom of the positional manipulation for exerting adjustable forces on the element, at least one position sensor for each degree of freedom of the positional manipulation for generating in each case a sensor signal that is characteristic of the position of the element, and at least one position controller, which in a position control circuit controls a force exerted on the element by the at least one actuator for the positioning of the element in dependence on the at least one sensor signal. At least one actuator and at least one position sensor are mounted on a common module frame.

21 Claims, 16 Drawing Sheets

(58) Field of Classification Search
USPC .......................................... 355/53, 67, 72–76
See application file for complete search history.

(56) References Cited

U.S. PATENT DOCUMENTS

| | | |
|---|---|---|
| 2003/0117600 A1 | 6/2003 | Taniuchi et al. |
| 2010/0321662 A1 | 12/2010 | Butler |
| 2011/0001947 A1 | 1/2011 | Dinger et al. |

FOREIGN PATENT DOCUMENTS

| | | |
|---|---|---|
| EP | 2 469 340 A2 | 6/2012 |
| WO | WO 2011/039036 A2 | 4/2011 |
| WO | WO 2012/152520 A1 | 11/2012 |
| WO | WO 2018/015079 A1 | 1/2018 |

OTHER PUBLICATIONS

International Preliminary Report on Patentability, with translation thereof, for corresponding PCT Appl No. PCT/EP2016/051027, dated Aug. 8, 2017.
International Search Report for corresponding PCT Appl No. PCT/EP2016/051027, dated May 31, 2016.

* cited by examiner

ARRANGEMENT FOR MANIPULATING THE POSITION OF AN ELEMENT

CROSS-REFERENCE TO RELATED APPLICATIONS

The present application is a continuation of, and claims benefit under 35 USC 120 to, international application PCT/EP2016/051027, filed Jan. 19, 2016, which claims benefit under 35 USC 119 of German Application No. 10 2015 201 870.9, filed Feb. 3, 2015. The entire disclosure of this application is incorporated by reference herein.

FIELD

The disclosure relates to an arrangement for manipulating the position of an element, in particular in an optical system. This may be in particular an optical system of a projection exposure apparatus.

BACKGROUND

Microlithography is used for producing microstructured components such as, for example, integrated circuits or LCDs. The microlithography process is carried out in what is called a projection exposure apparatus, which includes an illumination device and a projection lens. The image of a mask (reticle) illuminated via the illumination device is in this case projected via the projection lens onto a substrate (for example a silicon wafer) coated with a light-sensitive layer (photoresist) and arranged in the image plane of the projection lens, in order to transfer the mask structure to the light-sensitive coating of the substrate.

In a projection exposure apparatus designed for EUV (i.e. for electromagnetic radiation with a wavelength below 15 nm), mirrors are used as optical components for the imaging process because of the unavailability of light-transmissive materials. In the illumination device of a microlithographic projection exposure apparatus designed for operation in the EUV range, in particular the use of facet mirrors in the form of field facet mirrors and pupil facet mirrors as focusing components is known for example from DE 10 2008 009 600 A1. Such facet mirrors are constructed from a multiplicity of individual mirrors or mirror facets, which each may be designed to be tiltable by way of flexure bearings for the purposes of adjusting, or else for realizing, specific illumination angle distributions.

In a projection exposure apparatus, when manipulating the position of an element, such as for example a mirror, it is possible in principle for the respective position of a mirror to be measured via a position sensor and set to the desired value via a controller using an actuator. However, this fundamentally entails the problem that, on the basis of Newton's principle of "actio=reactio", every force exerted by an actuator on an element, such as for example the respective mirror, is accompanied by a force of reaction of the same amount acting in the opposite direction.

To illustrate this, FIG. 1 shows the breakdown of an open control circuit into an action path and a reaction path. According to FIG. 1, a position controller 11 generates a signal for an actuator 12, one component of the force that is produced by the actuator 12 being transferred in the action path to an element (for example mirror) 13 to be positioned and the other component of the force that is produced by the actuator 12 being transferred in the reaction path to mechanical components (for example force or sensor frames) located therein. This may involve the excitation of resonances—typically weakly damped resonances—of the mechanical components located in the reaction path, which at the desired bandwidth can in turn destabilize the position control circuit.

Known ways of overcoming this include the use of reaction masses for the respective actuators and the creation of a sensor frame that is mechanically decoupled from a carrying frame.

Reference is made merely by way of example to U.S. Pat. No. 6,788,386 B2 and WO 2012/152520 A1.

SUMMARY

The disclosure seeks to provide an arrangement for manipulating the position of an element in a projection exposure apparatus that makes it possible for the element to be manipulated as precisely and unproblematically as possible with comparatively little structural expenditure and a compact construction.

In one aspect, the disclosure provides an arrangement for manipulating the position of an element in at least one degree of freedom. The arrangement includes: at least one actuator for each degree of freedom of the positional manipulation for exerting adjustable forces on the element; at least one position sensor for each degree of freedom of the positional manipulation for generating in each case a sensor signal that is characteristic of the position of the element; and at least one position controller, which in a position control circuit controls a force exerted on the element by the at least one actuator for the positioning of the element in dependence on the at least one sensor signal. At least one actuator and at least one position sensor are mounted on a common module frame. The module frame is mechanically attached to a reference frame in such a way that the condition $0.5 \cdot \omega_B \leq \omega_{MR} \leq 2\omega_B$ is satisfied for the resonant frequencies ($\omega_{MR}$) of this attachment, where $\omega_B$ denotes the bandwidth of the position control circuit.

The disclosure is based on the idea that in principle two different—and in a certain way contradicting or conflicting—desired properties have to be met here with regard to the mechanical attachment of the module frame to the reference frame, as follows. On the one hand an attachment that is as rigid as possible is desirable from the aspect of the achievable positional stability of the element to be positioned (to the extent that this element should follow the position of the reference frame as well as possible). But, on the other hand, a rather more flexible mechanical attachment of the module frame to the reference frame is desirable from the dynamic aspect of the vibrational decoupling of the reaction path that is to be aimed for (to the extent that the vibrational properties of the reference frame should not, as far as possible, have an effect on the position control circuit).

Proceeding from this idea, the present disclosure involves the concept of steering a middle course with regard to the mechanical attachment of the module frame to the reference frame insofar as the resonant frequencies of this mechanical attachment are placed in a frequency band of ½ to 2 times the bandwidth $\omega_B$ of the position control circuit. The bandwidth of a control circuit is understood here as meaning the frequency of the "0 dB crossover" in the frequency response of the open control circuit (i.e. the frequency at which the open control circuit has the gain of one). Here, the theoretical 0 dB crossover of the action path, i.e. without the attachment resonance of the module frame, is referred to as the bandwidth. In this respect, the disclosure includes in particular a departure from an approach that intuitively first appears to offer itself, that of being certain to avoid the presence of mechanical resonances in the mechanical attachment of the module frame to the reference frame near the bandwidth of the control circuit in expectation of associated stability problems of the control circuit.

The disclosure makes use here of the finding that the choice or placement of the resonant frequencies of the mechanical attachment of the module frame to the reference frame in the frequency band defined above can achieve the effect that the attachment resonances of the mechanical attachment do not for instance lead to a destabilization of the position control circuit, but can even be effectively damped by the position control circuit without additional active or passive damping measures being used for this.

Furthermore, the fact that at least one actuator and at least one position sensor (in particular also all the actuators and position sensors) are mounted on a common module frame has the effect of creating a modular construction of the arrangement or positioning device, which makes easy assembly and easy integration in the respective system possible. On account of the aforementioned decoupling of the module frame to a great extent from the dynamics of the reference frame, the aforementioned module containing the actuator and the position sensor on a common module frame can be separately installed and also separately tested before installation, it also being possible at the same time to dispense with additional active elements such as sensors, actuators or controllers with regard to the mechanical attachment of the module frame to the reference frame.

As a result, with joint consideration both of the mechanical or dynamic construction on the one hand and the technical control aspects on the other hand, the disclosure thus provides a particularly simple and comparatively low-cost architecture of an arrangement or positioning device that is particularly suitable for example (without the disclosure being restricted thereto) for the active positioning of optical elements such as mirrors or lenses, in particular also for mirror facets of a facet mirror.

According to the disclosure, it is made possible when manipulating the element on the one hand to follow a reference frame well and on the other hand to obtain a high controller bandwidth by sufficiently suppressing the reaction path.

According to one embodiment, the arrangement has precisely one actuator for each "manipulated degree of freedom", i.e. for each degree of freedom in which a manipulation takes place.

In further embodiments, the arrangement has at least two actuators for each manipulated degree of freedom, the forces that are exerted on the element by these actuators being adjustable independently of one another.

According to one embodiment, the arrangement has:
at least two actuators for each degree of freedom of the positional manipulation; and
at least one position controller, which controls forces exerted by the actuators independently of one another in a position control circuit in dependence on the at least one sensor signal, at least one of the actuators exerting a force on the element;
at least one of these actuators being assigned a further element with a reaction mass in such a way that the force of reaction accompanying the force exerted on the element to be positioned by the actuator concerned acts on this reaction mass.

According to one aspect, the disclosure also relates to an arrangement for the positional manipulation of an element, in particular in an optical system, with:

at least two actuators for each degree of freedom of the positional manipulation;
at least one position sensor for each degree of freedom of the positional manipulation for generating in each case a sensor signal that is characteristic of the position of the element; and
at least one position controller, which controls forces exerted by the actuators independently of one another in a position control circuit in dependence on the at least one sensor signal, at least one of the actuators exerting a force on the element; and
at least one of these actuators being assigned a further element with a reaction mass in such a way that the force of reaction accompanying the force exerted on the element to be positioned by the actuator concerned acts on this reaction mass.

According to this approach, the disclosure is also based on the concept of applying forces on the one hand to the element to be positioned and on the other hand to the module frame by using at least two actuators that can be operated independently of one another. In particular, in this case a first of these actuators can produce a force on the element to be positioned that is accompanied by a force of reaction on the module frame. At the same time, a second of these actuators can be activated in such a way that it compensates for the said force of reaction associated with the first actuator. As a result, in this way the degree of freedom gained by the at least one additional actuator can be used to the effect that effectively no resultant force is applied any longer to the reference frame, with the consequence that a decoupling from the dynamics of the reference frame is achieved.

According to one embodiment, the force of reaction accompanying the force that is exerted on the element to be positioned by at least one of the actuators can be compensated by another actuator of the at least two actuators.

According to one embodiment, the at least two actuators and the position sensor are mounted on a common module frame.

According to one embodiment, the at least one reaction mass is mechanically attached to this module frame.

According to one embodiment, the arrangement also has an acceleration precontrol, which modifies the force exerted on the element to be positioned on the basis of an acceleration of the reference frame.

The use of such an acceleration precontrol offers the possibility of determining in advance the force that applied to the element to be positioned in order for it to follow the reference frame, with as little deviation as possible, from the acceleration of the reference frame on the basis of the relationship $f_E = m_E a_{BR} \approx m_E a_{MR}$ and correspondingly precontrolling this force, whereby the positional stability of the element with respect to the module frame can be increased considerably.

According to one embodiment, the arrangement has an acceleration sensor for measuring the acceleration of the reference frame. According to one embodiment, this acceleration sensor is mounted on the module frame. The placement of the acceleration sensor on the module frame is advantageous here on the one hand with regard to this being conducive to the modularity and allowing the acceleration sensor to be interconnected directly with the position sensor and the actuator with a possibly local control unit. On the other hand, as still to be explained in more detail, the filtering with the weakly damped attachment resonance offers an effective suppression of undesired high-frequency acceleration signals, without the desired low-frequency acceleration signals being significantly delayed thereby.

In further embodiments, the acceleration sensor may also be mounted on the reference frame.

According to one embodiment, the arrangement also has a deformation compensation controller, which at least partially compensates for a deformation of the mechanical attachment of the module frame to the reference frame.

Such a configuration has the advantage that the deformation of the attachment rigidity of the module frame can be taken into account, it being possible for this deformation to be calculated if the rigidity and the mass of the system and also the acceleration (for example determined with the aforementioned acceleration sensor) are known. The signal thereby determined can in turn be passed to the position control circuit as a setpoint injection, in order that the setpoint value prescribed to the position controller is increased or reduced correspondingly in order to compensate for the said deformation of the attachment rigidity of the module frame.

According to one embodiment, the arrangement is designed for manipulating the position of the element in a plurality of degrees of freedom, the arrangement having at least one actuator for each degree of freedom of the positional manipulation for exerting adjustable forces on the element and at least one position sensor for each degree of freedom of the positional manipulation for generating a sensor signal that is characteristic of the position of the element.

According to one embodiment, the arrangement is designed for manipulating the position of a plurality of elements in at least one degree of freedom, the elements being mounted together on the module frame.

According to one embodiment, the arrangement has for a plurality of elements a common additional actuator for each degree of freedom of the positional manipulation to compensate for forces of reaction.

According to one embodiment, the module frame has a mass that is no more than 10 times the mass of the element to be positioned, the mass of the module frame preferably lying in the range of 2 times to 6 times the mass of the element to be positioned. The smaller the mass of the module frame in relation to the mass of the element, the higher the achievable damping of the attachment resonance of the module frame by the position control circuit of the element. Such a comparatively small and compact configuration of the module frame also makes possible an arrangement in which resonances only really occur above (for example greater by a factor of 10) the bandwidth, with the consequence that stability problems in the position control circuit can be effectively prevented.

The element to be positioned according to the disclosure may be in particular a mirror or a lens. In particular, the element to be positioned may be a mirror facet of a facet mirror, this facet mirror having a plurality of mirror facets.

The disclosure also relates to a projection exposure apparatus with an arrangement according to the disclosure. The projection exposure apparatus may be designed in particular for operation in EUV. In further applications, the projection exposure apparatus may also be designed for operation in the VUV range, for example for wavelengths less than 200 nm, in particular less than 160 nm.

Further configurations of the disclosure can be gathered from the description and the dependent claims.

The disclosure is explained in greater detail below on the basis of exemplary embodiments illustrated in the accompanying figures.

DETAILED DESCRIPTION OF PREFERRED EMBODIMENTS

Figure 1:
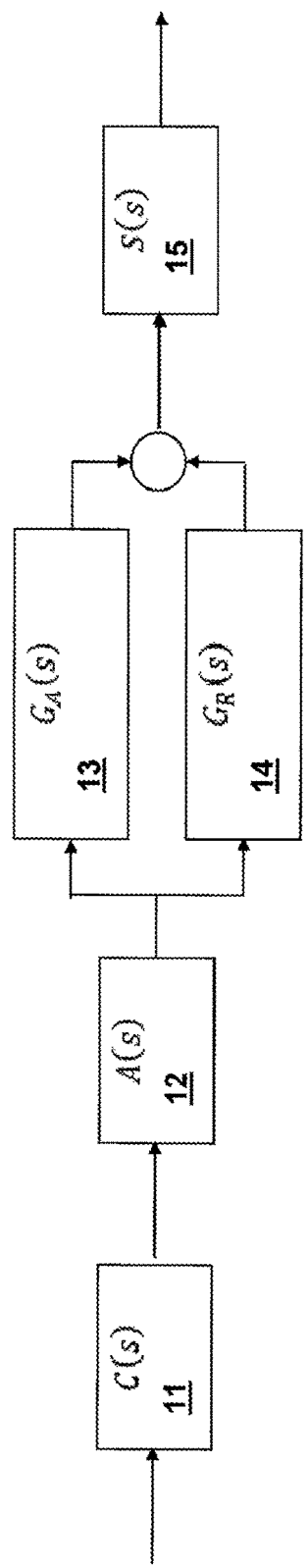
FIG. 1 shows a schematic representation for illustrating the action path and reaction path in a position control circuit.
Figure 2:
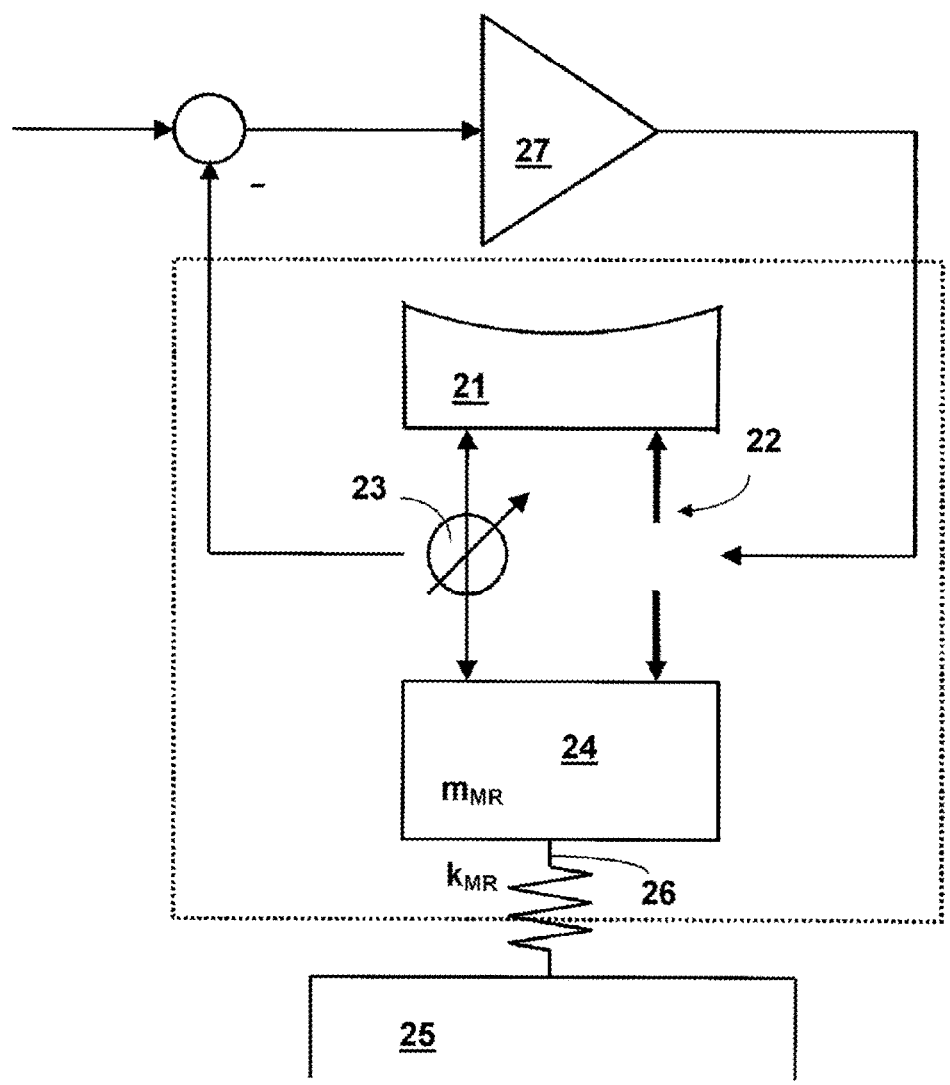
FIGS. 2-14 show schematic representations for explaining the concept according to the disclosure on the basis of different embodiments.

FIG. 2 shows a schematic representation of the possible construction of an arrangement for manipulating the position of an element in a first embodiment.

In the arrangement from FIG. 2, an actuator 22 applies a force to an element 21 to be positioned (for example a mirror). On the basis of the Newtonian principle of "actio=reactio", this force exerted on the element 21 by the actuator 22 is accompanied by a force of reaction of the same amount acting in the opposite direction. The actuator 22 and also a position sensor 23 are mounted on a common module frame 24, and so the force of reaction has a retroactive effect on the module frame 24. The module frame 24 is mechanically attached to a reference frame 25, this mechanical attachment being symbolized by a spring 26 with a spring stiffness k. The position sensor 23 measures the position of the element 21 in relation to the module frame 24; if there is a deviation of this position signal from the desired position of the element, forces that counteract the determined deviation in the position control circuit thus formed are set via a position controller 27 using the actuator 22.

According to the disclosure, in the construction according to FIG. 2 the module frame 24 is thus mechanically attached to the reference frame 25 in such a way that, for the resonant frequencies ($\omega_{MR}$) of this attachment, the condition $$0.5 \cdot \omega_B \leq \omega_{MR} \leq 2\omega_B \quad (1)$$

is satisfied, where $\omega_B$ denotes the bandwidth of the position control circuit.

From the aspect of the best possible reaction of the position control circuit even to smallest deviations of the position signal from the desired position of the element 21, in principle a maximization of the gain of the position control circuit would be desirable, though there are limits to increasing this gain due to the presence of resonances in the mechanical attachment of the module frame 24 to the reference frame 25 and the risk therefore existing in principle of the occurrence of stability problems. This problem is further exacerbated by the typical absence of damping of the natural vibrations occurring due to the lack of suitable materials coming into consideration in an EUV system.

Figure 3:
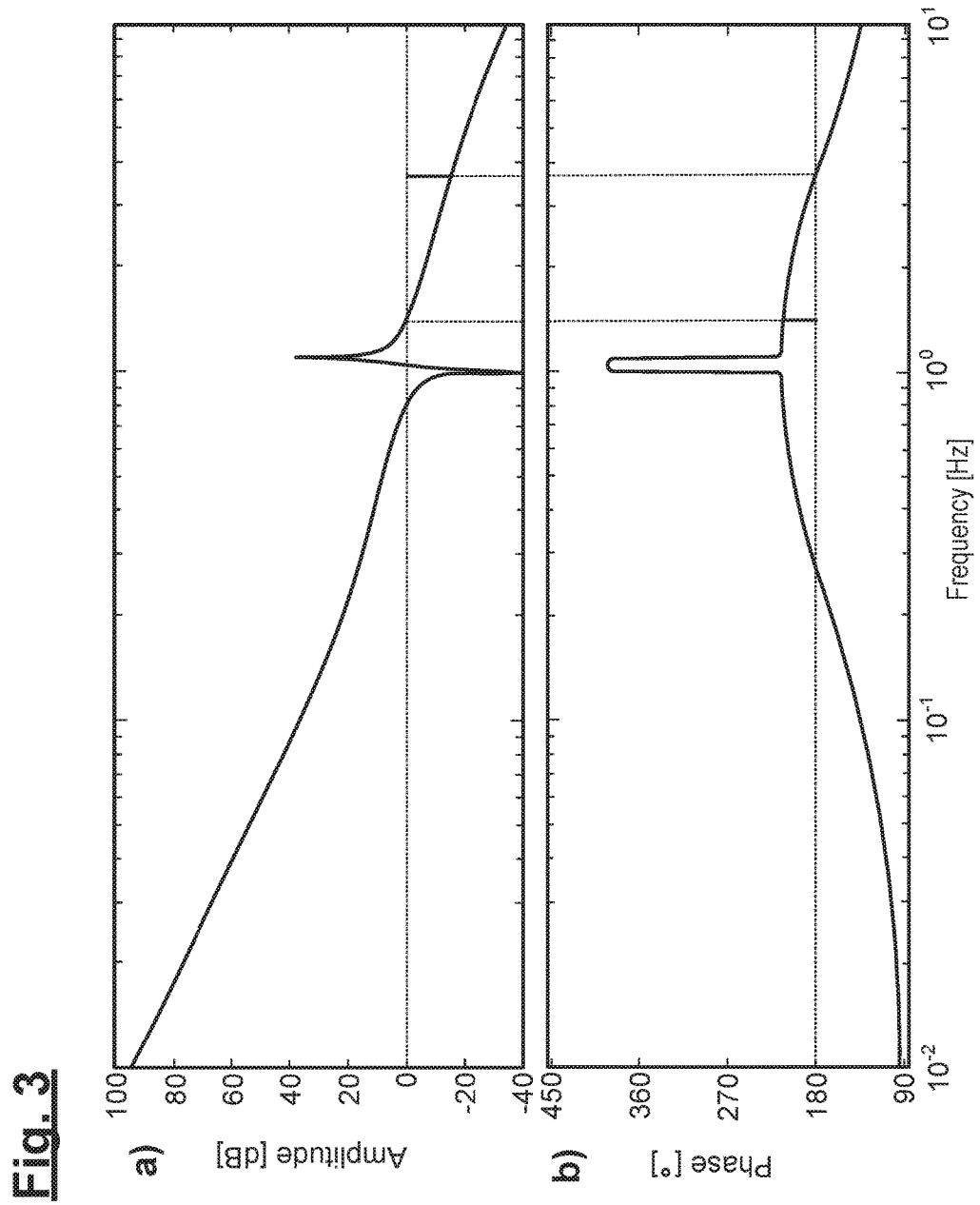

On the basis of the arrangement according to FIG. 2, in FIGS. 3a-b there is shown firstly the frequency response of the open control circuit on the basis of Bode diagrams for the control respectively along an axis (i.e. element 21 or mirror to be positioned, position sensor 23, position controller 27 and actuator 22 are connected in series). The frequency plotted on the horizontal axis is in this case respectively normalized to the bandwidth, the bandwidth corresponding to that frequency at which the gain of the open control circuit is one (corresponding to 0 dB); the controller is therefore capable of suppressing disturbances. Above the bandwidth, the gain decreases to a value below 1, so that the controller is then no longer effective. The phase position of the control circuit is represented in FIG. 3b. The distance of the curve according to FIG. 3b from the 180° value at the frequency that corresponds to the bandwidth is also referred to as the "phase reserve". FIG. 3 reveals a phase reserve of approximately 31° and the conclusion that the position control behaves stably during the closing of the control circuit. On account of the considerable gain (>>0 dB) at the resonant frequency, even the attachment resonance of the module frame is damped by the control circuit.

Figure 4:
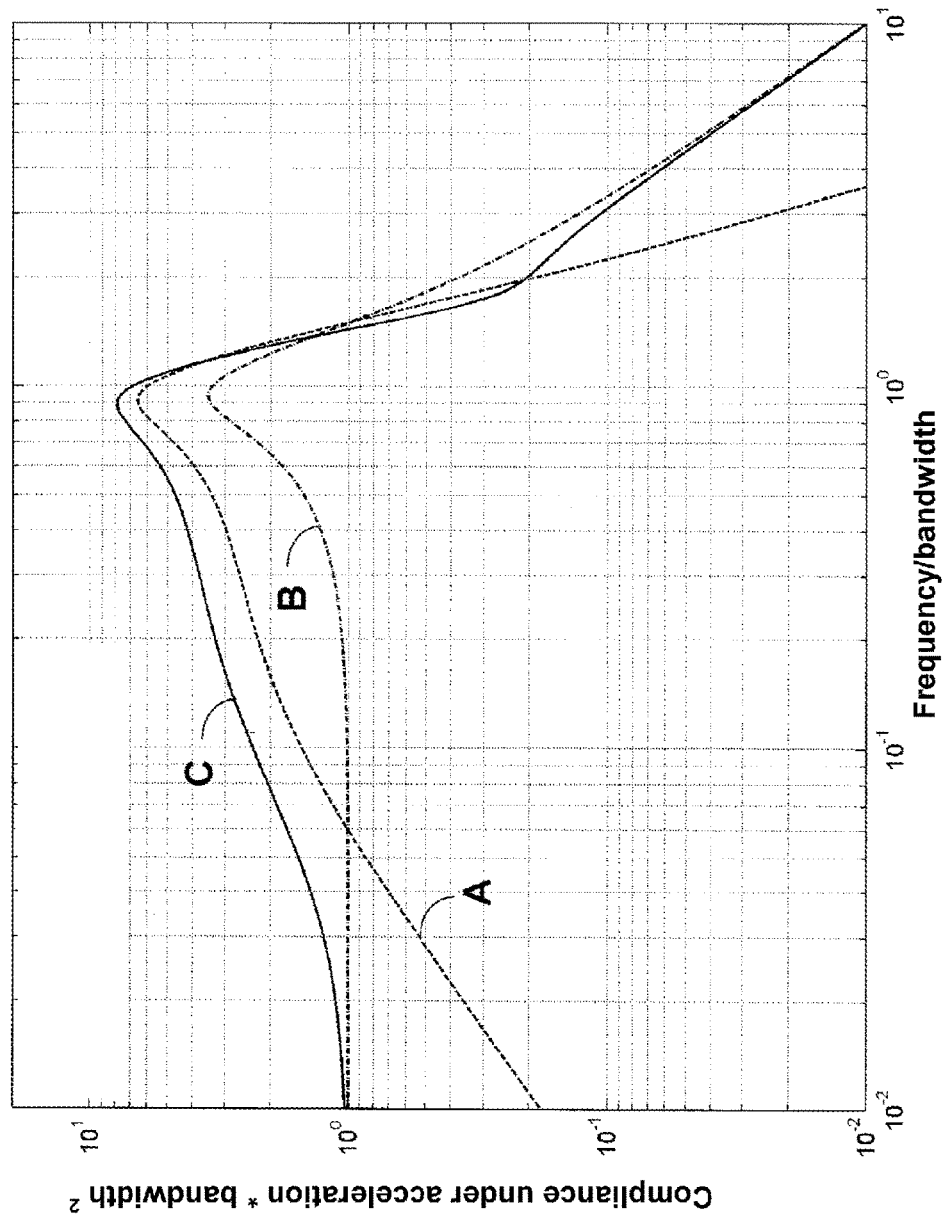

FIG. 4 serves for showing the "dynamic compliance" of the arrangement shown in FIG. 3. Curve "A" in FIG. 4 shows the dynamic behavior of the element 21 to be positioned in relation to the module frame 24, curve "B" shows the dynamic behavior of the module frame 24 in relation to the reference frame 25, and curve "C" shows the resultant dynamic behavior (obtained by adding the two curves "A" and "B") of the element 21 to be positioned in relation to the reference frame 25. In this case, the component attributable to the curve "B" is based substantially on the mechanical attachment of the module frame 24 to the reference frame 25, whereas the component attributable to the curve "A" is based substantially on the position control. As can be seen from FIG. 4, on the one hand quite a good balancing of the two components is achieved, and on the other hand also already an effective damping of the resonance by the position control circuit.

A mechanical attachment of the module frame 24 to the reference frame 25 that is too rigid would have the consequence that the module frame 24 would to a certain extent effectively form "a body" with the reference frame 25 and the resonances originating from the reference frame 25 (and already at relatively low frequencies) would be "evident" in the position control circuit. By contrast, the architecture according to the disclosure, described above with reference to FIGS. 2-5, has the advantage that the module frame 24 can firstly be designed as comparatively compact and with high natural frequencies, it being decoupled from the reference frame 25, but at the same time the mechanical attachment being rigid enough that the position to be assumed by the reference frame 25 is not lost.

As explained in more detail below with reference to FIGS. 5-6, the resultant positional stability of the module frame attached to the reference frame or of the element to be positioned can be further increased by using an acceleration precontrol. In this case, from FIG. 5, components analogous or substantially functionally identical in comparison with the arrangement from FIG. 2 are designated by reference numerals increased by "30".

Figure 5:
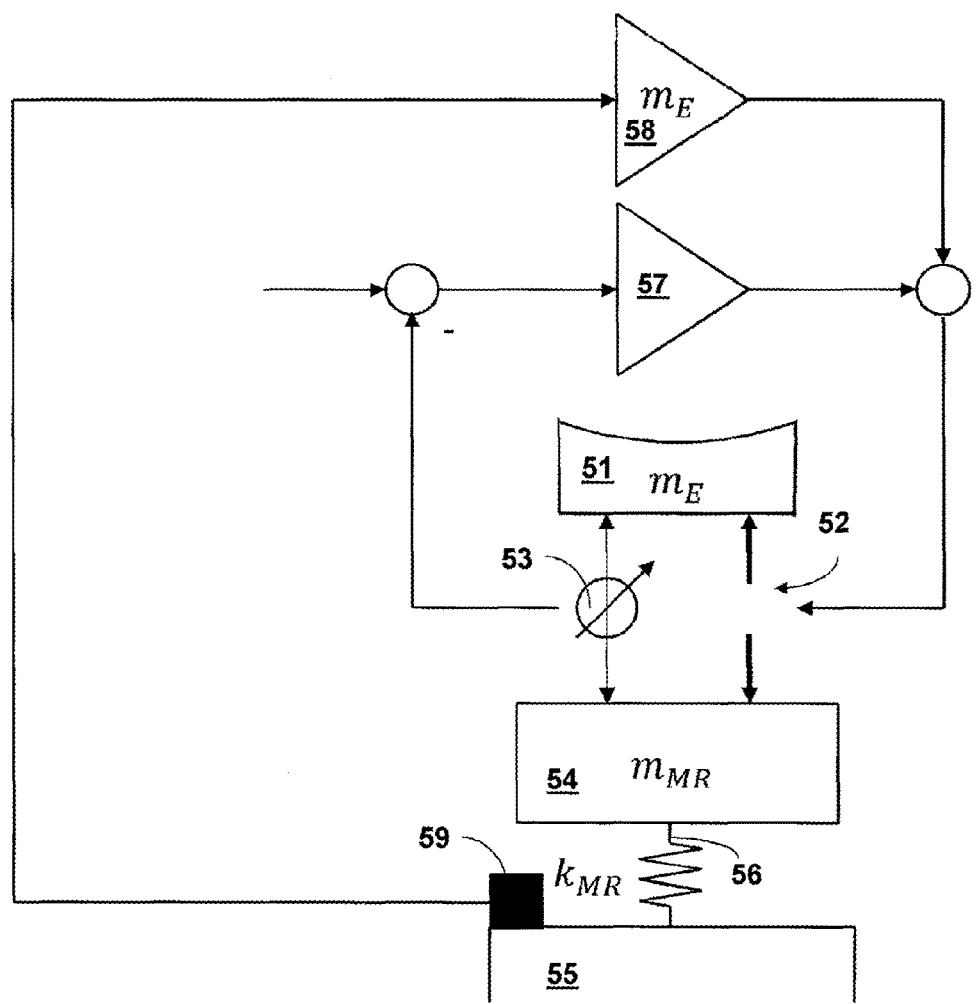

The acceleration precontrol obtained in the arrangement according to FIG. 5 is based on the idea of determining the force $f_E$ that applied to the element 51 to be positioned in order for it to follow the reference frame 55, with as little deviation as possible, from the acceleration of the reference frame 55 measured with an acceleration sensor 59 according to $$f_E = m_E a_{BR} \approx m_E a_{MR} \qquad (2)$$

and precontrolling it, whereby the positional stability of the element 51 with respect to the module frame 54 can be increased considerably. Here, $m_E$ denotes the mass of the element 51 to be positioned, $a_{BR}$ denotes the acceleration of the reference frame 55 and $a_{MR}$ denotes the acceleration of the module frame 54.

Figure 6:
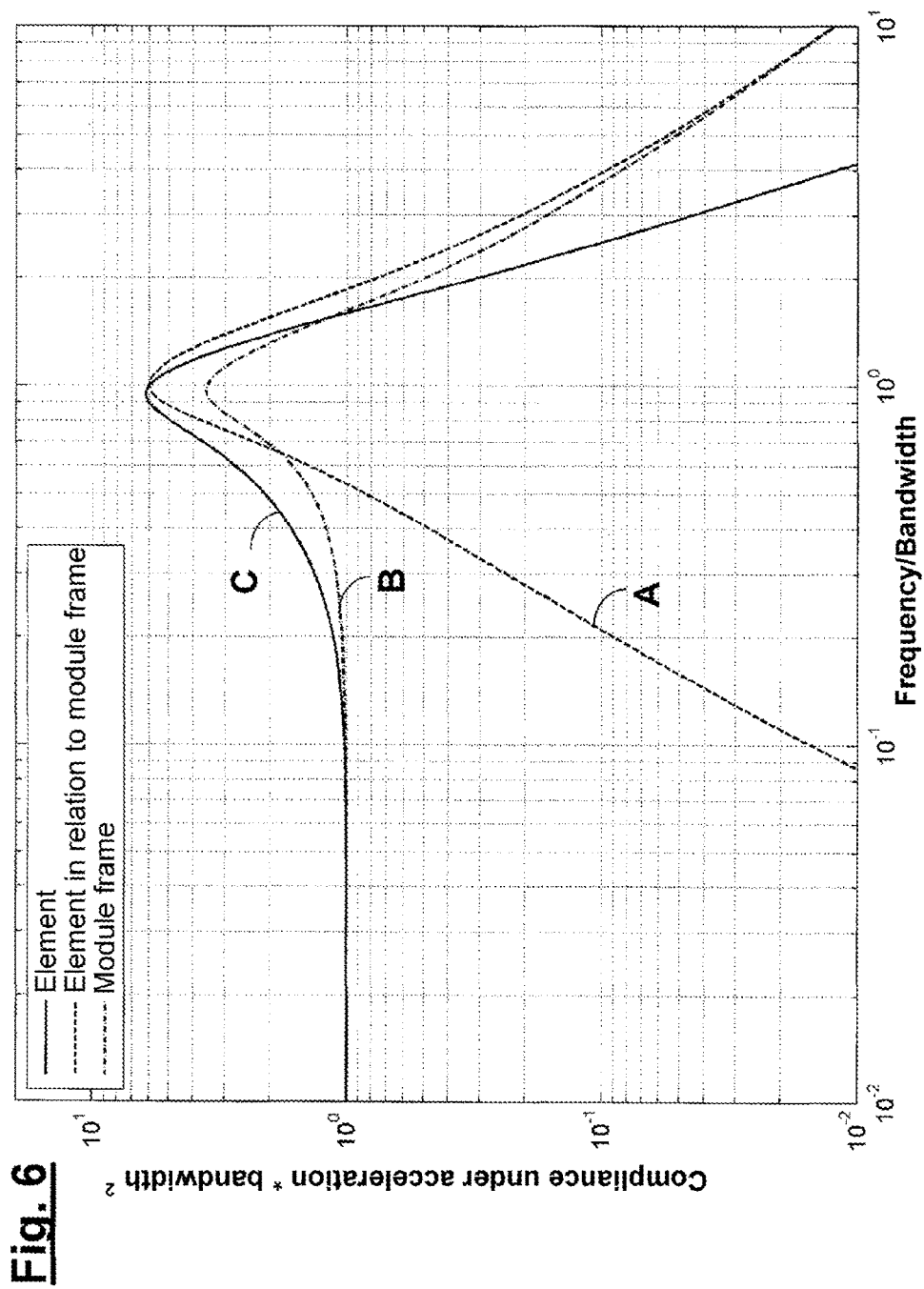

As can be seen from FIG. 6, as a consequence the contribution of the compliance of element 51 in relation to the module frame 54 that is represented by the curve "A", that is to say the contribution attributable to the control, is reduced significantly (and virtually to zero).

As explained in more detail below with reference to FIGS. 7-8, the resultant positional stability of the module frame attached to the reference frame or of the element to be positioned can be further increased by using a compensation of the "quasi-static deformation" of the attachment. It is taken into account here that the positional stability of the element to be positioned with respect to the reference frame is also determined inter alia by the ("quasi-static") compliance of the attachment of the module frame to the reference frame for disturbances with frequencies below the attachment resonant frequency.

Figure 7:
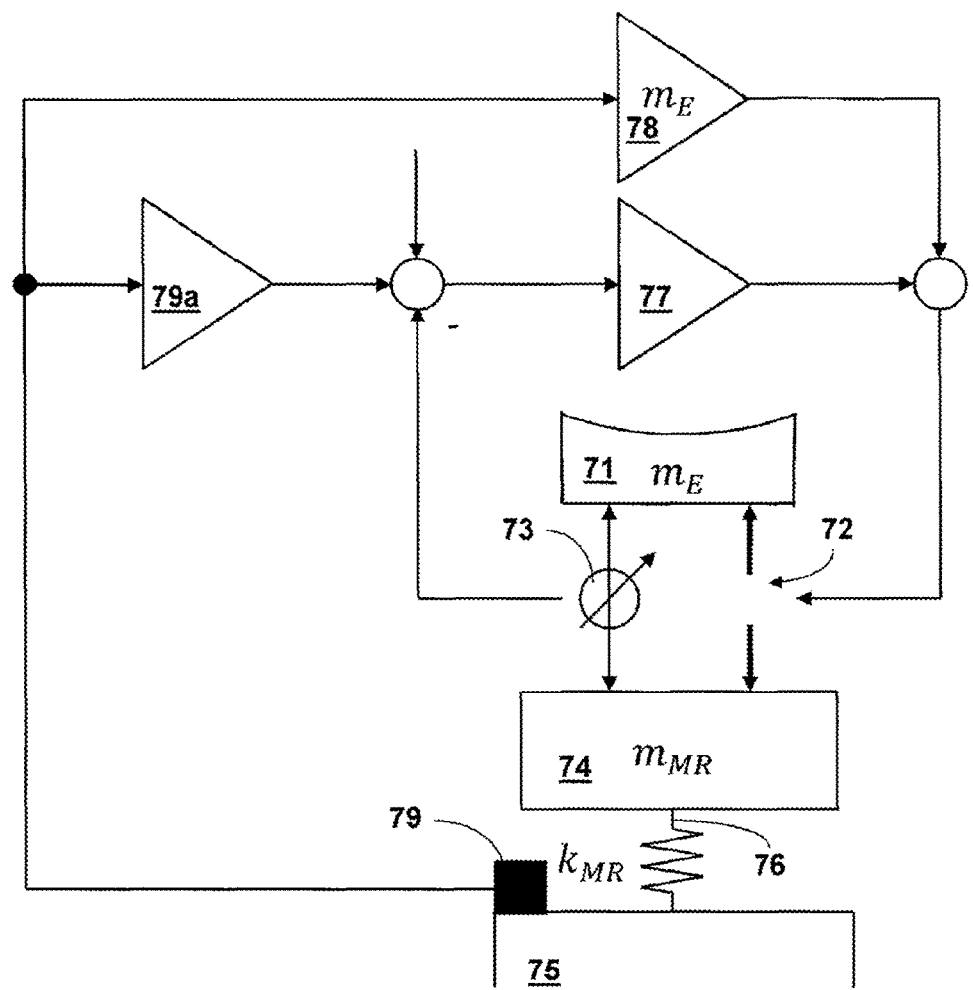
Figure 8:
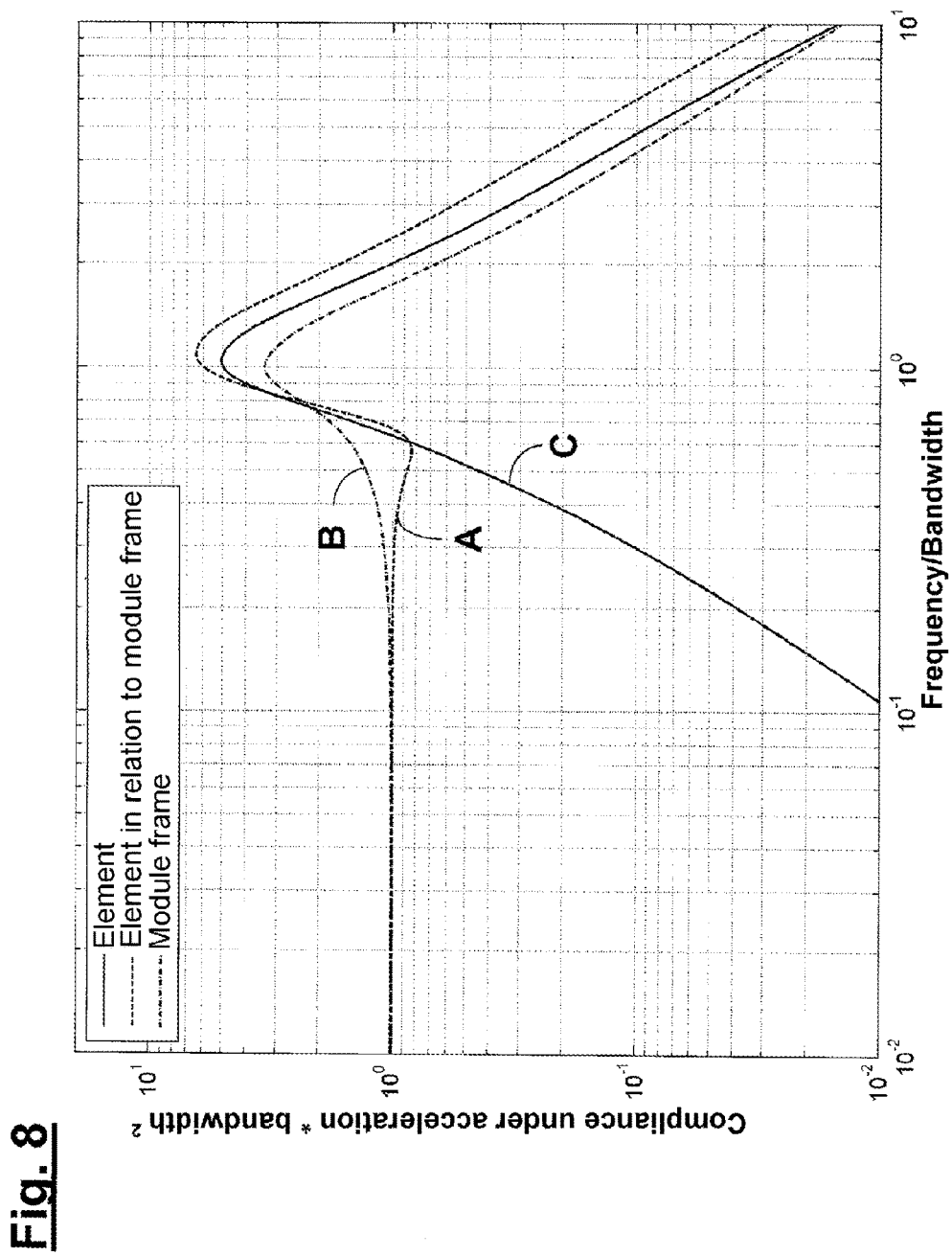

In this case, from FIG. 7, components analogous or substantially functionally identical in comparison with the arrangement from FIG. 5 are designated by reference numerals increased by "20".

In this way, the problem remaining in the case of the embodiments according to FIG. 2 and FIG. 5 of the deformation of the attachment rigidity, i.e. an attachment defect in the mechanical attachment of the module frame 74, can be taken into account. This approach is based on calculating how great the deformation of the spring 76 representing the mechanical attachment will be if the rigidity and the mass of the system are known and the acceleration is also known (from the acceleration sensor 79). This signal can in turn be passed to the position control circuit, in order that the prescribed setpoint value of the force exerted on the element 71 for positioning should be increased or reduced correspondingly in order to compensate for the said deformation of the spring 76 or of the attachment rigidity of the module frame 74. In FIG. 7, "79a" denotes a corresponding deformation compensation controller, which at least partially compensates for a deformation of the mechanical attachment of the module frame 74 to the reference frame 75.

For this purpose, the quasi-static deformation of the attachment of the module frame 74 is determined from the acceleration signal according to $$q_{MR} = \frac{m_{MR} + m_E}{k_{MR}} a_{BR} \approx \frac{m_{MR} + m_E}{k_{MR}} a_{MR} \qquad (3)$$

and injected into the position control circuit as a setpoint value. The element 71 to be positioned then performs a compensating movement opposite to the deformation and of the same magnitude.

Any kinematic reversal there may be between the actuator 72 and the element 71 (for example "translation" to "angle" as in the embodiment described further below according to FIG. 15) can be correspondingly taken into account in the equations. If disturbances at or above the attachment resonance are also to be suppressed, the quasi-static compensation model can be replaced by a dynamic compensation model. Furthermore, for drift correction below the bandwidth of the acceleration sensor 79, between the module frame 74 and the reference frame 75 there may be introduced a position sensor, the strongly lowpass-filtered deformation signal (<<$\omega_B$) of which is added to the reference variable.

As can be seen from FIG. 8, although the dynamic behavior of the module frame 74 (curve "B") continues as before to produce an error in the case of frequency/bandwidth values below 10°, the contribution of the movement of the element 71 in relation to the module frame 74 (curve "A") produces exactly the same error with a different sign (the latter cannot be seen in the representation of the amount), and so the sum of the two contributions is substantially zero if the signals are exactly in phase (which is the case at low frequencies). As a consequence, the compliance obtained overall for low frequencies tends toward zero. As a result, in the event that the reference frame 75 moves, the element to be positioned for low frequencies actually substantially follows this movement of the reference frame 75.

The acceleration sensor 79 may be placed either on the reference frame 75 or on the module frame 74, since the module frame 74 follows the reference frame 75 almost without any delay up to the attachment frequency. The placement of the acceleration sensor 79 on the module frame 74 is advantageous here on the one hand with regard to this being conducive to the modularity and allowing the acceleration sensor 79 to be interconnected directly with the position sensor 73 and the actuator 72 with a possibly local control unit. On the other hand, the filtering with the weakly damped attachment resonance offers an effective suppression of undesired high-frequency acceleration signals (−40 dB/decade as from the attachment resonant frequency), without the desired low-frequency acceleration signals being significantly delayed thereby. Conversely, with the initially discussed embodiment with an actuator 72, the placement of the acceleration sensor 79 on the module frame 74 may prove to be problematic insofar as it leads to the acceleration precontrol becoming a feedback, since the precontrolling force produced has a retroactive effect on the module frame 74, and consequently on the acceleration sensor 79, which in the case of a small mass of the module frame 74 (as is possible in principle for instance with an order of magnitude of 2 to 6 times the mass of the element 71) may lead to an instability of the system. In the case of a comparatively great mass of the module frame ($m_{MR} \gg 10 m_E$), on the other hand, the acceleration sensor 79 may be placed on the module frame 74.

Figure 9:
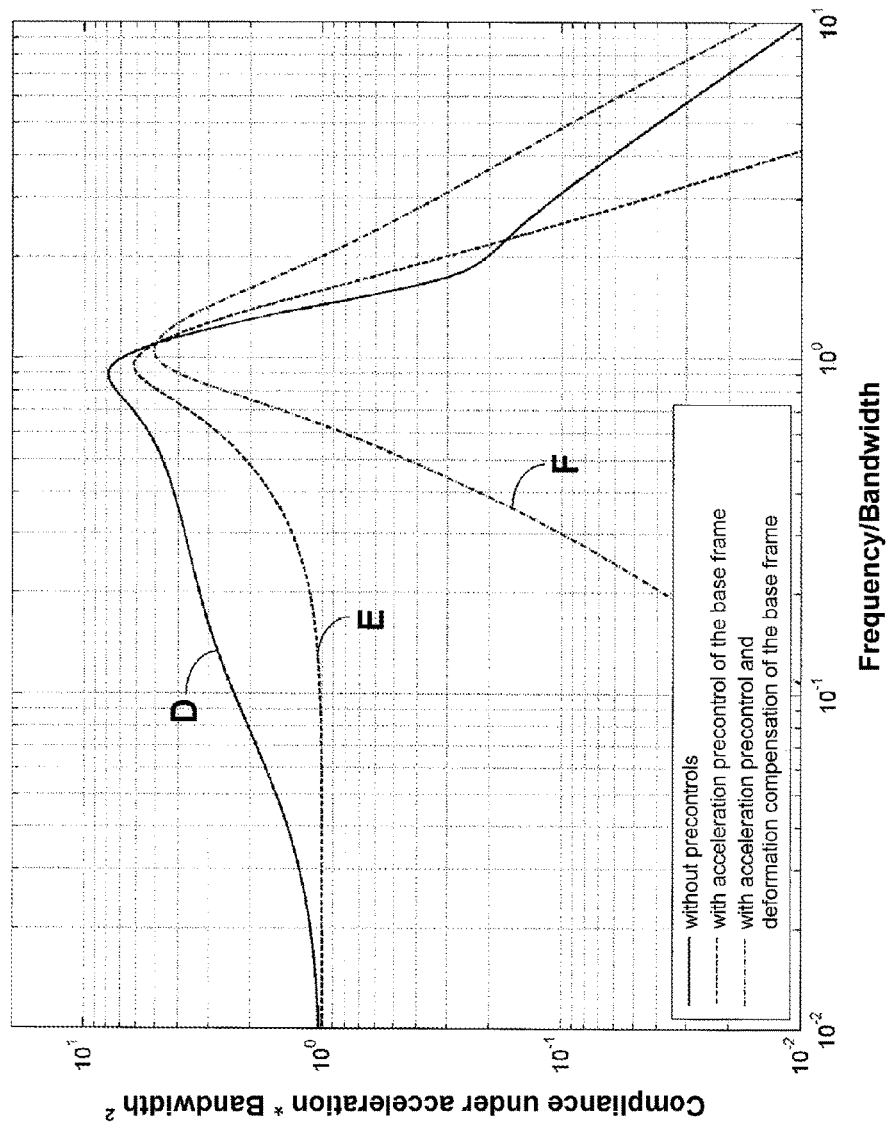

In FIG. 9, the development stages of the arrangement according to the disclosure with an actuator without additional precontrol (curve "D"), with additional acceleration precontrol (curve "E") and with additional acceleration precontrol and additional deformation compensation with regard to the attachment of the module frame 74 (curve "F") that have been described above with reference to FIG. 2, FIG. 5 and FIG. 7 are represented once again in an overview.

A further aspect of the present disclosure is described below with reference to FIG. 10ff. This is based on the concept of using at least two actuators that are independent of one another to provide a configuration in which forces effectively do not have any retroactive effect in the first place on the reference frame, an advantageous arrangement of these actuators already allowing good decoupling to be achieved. The presence of two actuators makes it possible here in each case for forces to be applied on the one hand to the element to be positioned and on the other hand to the module frame substantially independently of one another. In other words, a "lever" or degree of freedom additionally gained by the presence of two actuators can be used to the effect that effectively no forces at all are applied any longer to the reference frame, and as a result a decoupling from the dynamics thereof is achieved.

Figure 11:
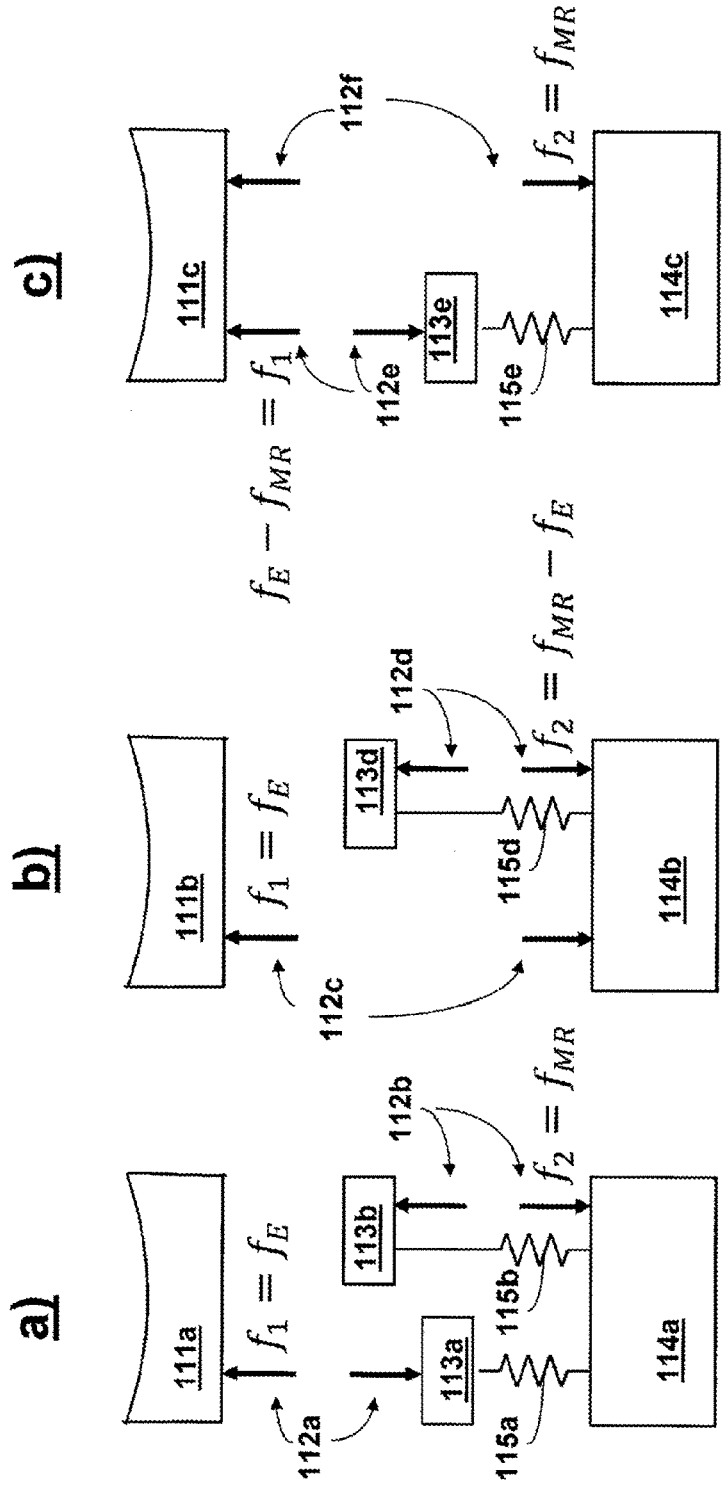

In this case, the forces of reaction accompanying the forces produced by the two actuators can be absorbed by in each case an additional auxiliary mass (also referred to hereinafter as the "reaction mass"). As schematically represented in FIG. 11a, a reaction mass may be used here for each actuator. In further embodiments, according to FIGS. 11b,c, the number of reaction masses used can also be reduced to one, by one of the two actuators acting with a force or force of reaction on the element to be positioned and the module frame and the other of the two actuators being activated in such a way that it compensates for the force of reaction associated with the other actuator.

Specifically, according to FIG. 11a, each of the two actuators 112a, 112b is assigned an auxiliary mass 113a and 113b, respectively ("reaction mass"). According to FIG. 11b, a second actuator 112d with an auxiliary mass 113d is used in conjunction with an actuator 112c, which produces both a force of action and a force of reaction, it effectively being possible for the second actuator 112d to be used to produce a second force, which only acts on the module frame 114b. Since the forces of reaction applied by the first actuator 112c are known, they can be compensated again by using the second actuator 112d.

According to FIGS. 11a-c, the auxiliary mass(es) is or are for its/their part mechanically attached by way of a comparatively flexible spring 115a, 115b, 115d or 115e to the module frame 114a, 114b or 114c, respectively, and so to this extent no appreciable forces are transferred any longer to the module frame 114a, 114b or 114c. In further embodiments, the spring 115a, 115b, 115d or 115e may also be mechanically attached to the element to be positioned 111a, 111b or 111c, respectively, or to the reference frame (not represented in FIGS. 11a-c).

Figure 12:
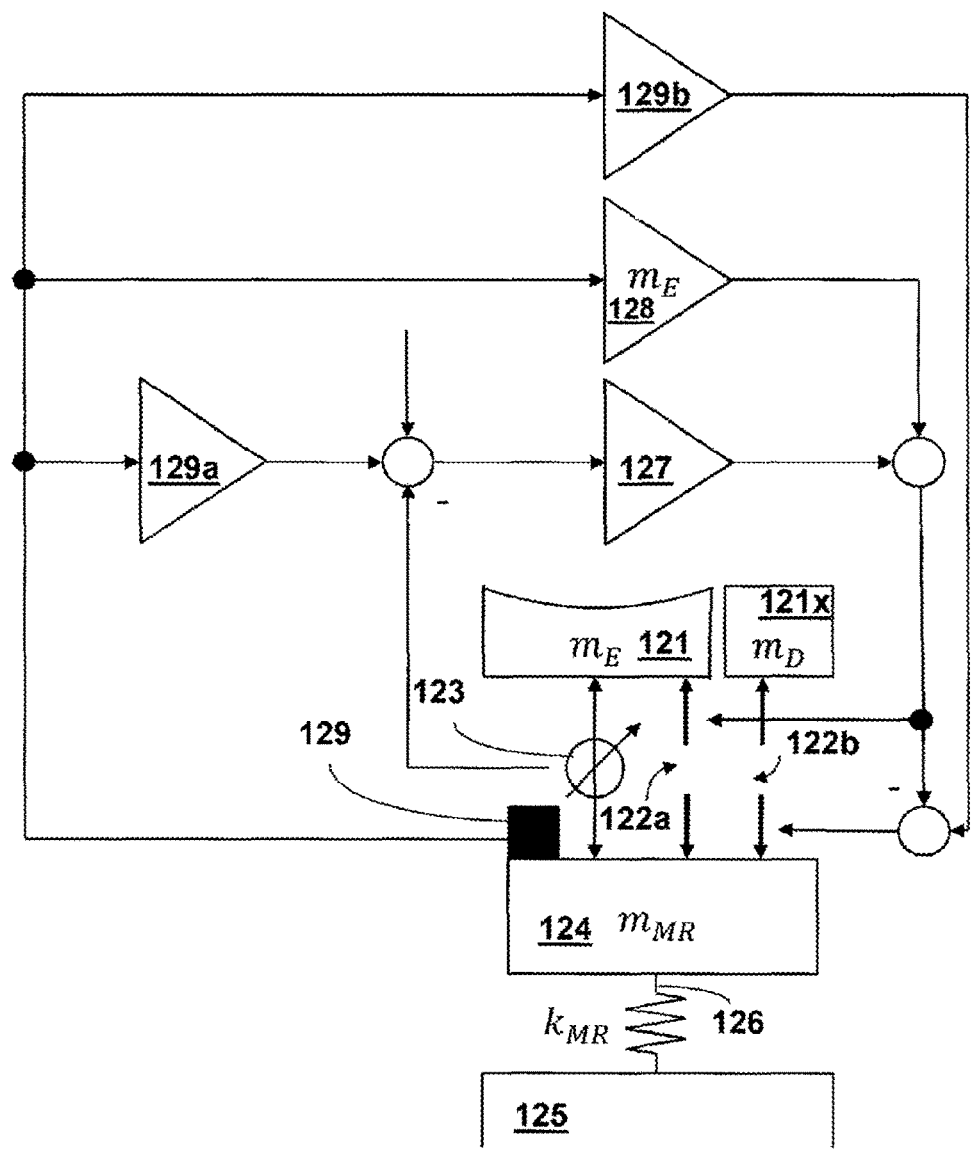

In FIG. 12, $m_E$ denotes the mass of the element 121 to be positioned, and $m_D$ denotes an additional auxiliary mass of an additional element 121x, which may for example be an unused mirror facet in a facet mirror. A first actuator 122a exerts on the element 121 to be positioned a force that is accompanied by a force of reaction on the module frame 124. A second force (independent of the force of the actuator 122a), which likewise acts on the module frame 124, is produced on the auxiliary mass of the additional element 121x via a second actuator 122b.

Figure 10:
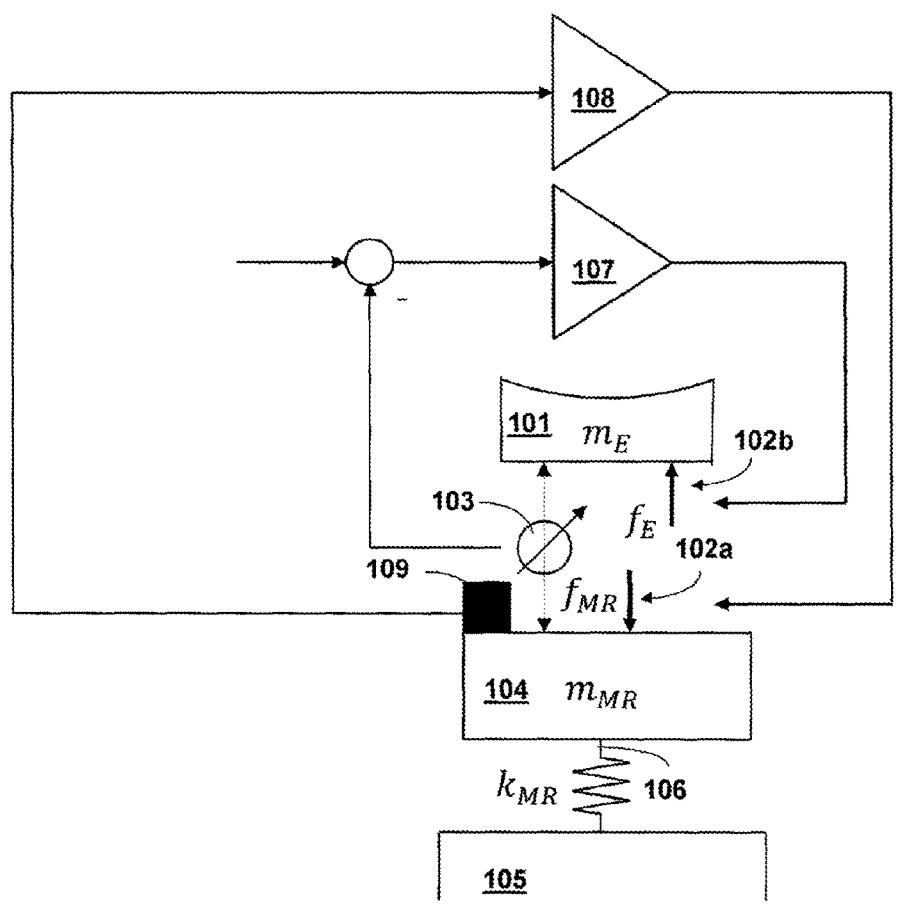

The production of two forces that are independent of one another, provided in the way described above, may also be shown in the basic representation of FIG. 10 such that an active damping is produced by a second (virtual) actuator, which only acts on the module frame 104, in conjunction with an acceleration sensor 109. As a result, this can be regarded to a certain extent as a way of providing an actuator that is effectively "free from forces of reaction" insofar as the force of reaction does not act on the module frame attached both to the optical element and to the position sensor, but on another (auxiliary) mass.

Figure 13:
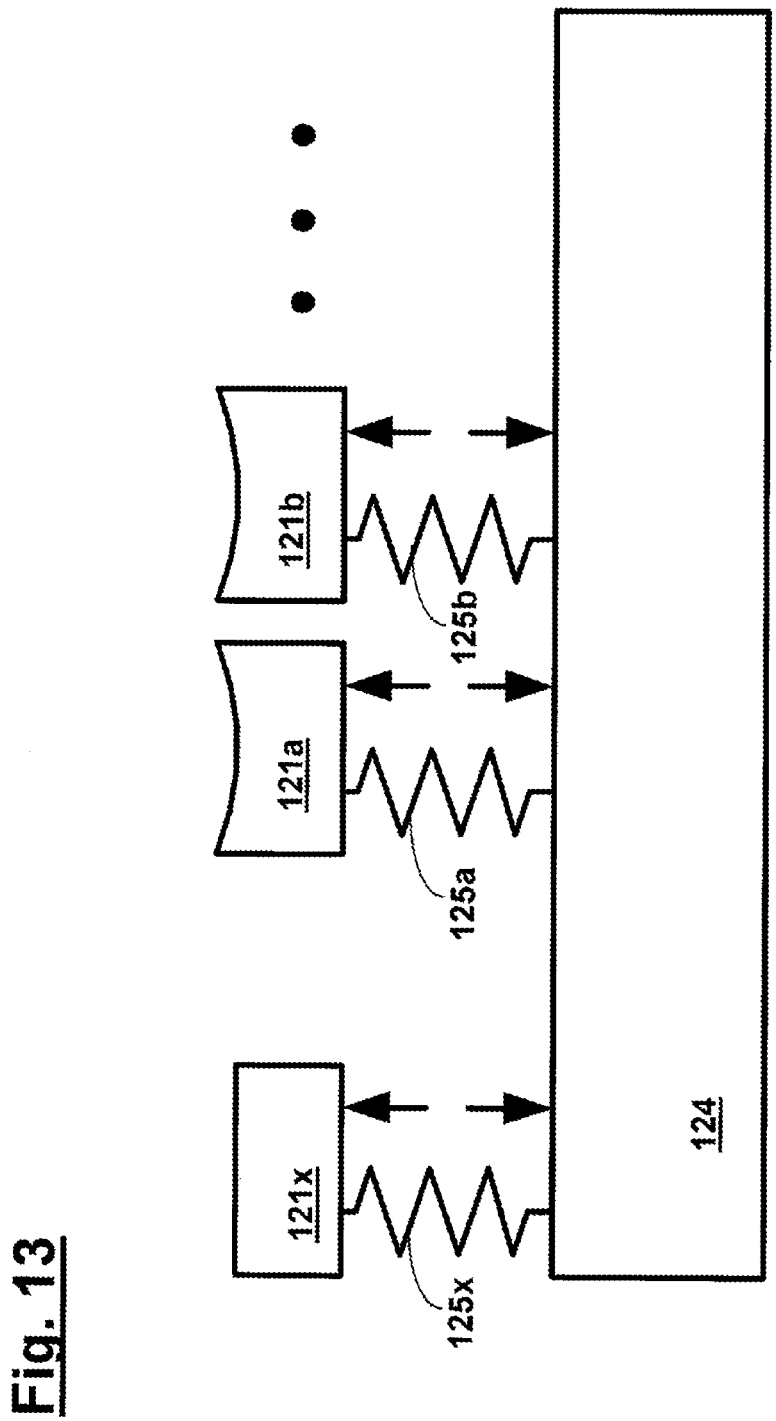

In the embodiment from FIG. 11b, the reaction mass can for example be provided by an element that is only used for this purpose and otherwise is not required or does not perform any further function in the system (="dummy element"), even a single dummy element being sufficient in an arrangement with a plurality of elements to be positioned to compensate for the respectively resultant force of reaction for all the elements to be positioned. Such an arrangement is schematically indicated in FIG. 13, it being possible for the plurality of elements 121a, 121b, . . . to be positioned, which according to FIG. 13 are mechanically attached in each case by way of a spring 125a, 125b, . . . to a common module frame 124, to be for example mirror facets of a facet mirror (for example of a field facet mirror or of a pupil facet mirror). The additional "dummy element", just performing the function of an auxiliary or reaction mass, is denoted in FIG. 13 by "121x", this illustrating the further advantage that, with a typically high number of elements 121a, 121b, . . . to be positioned (which depending on the application may be several tens or even several hundreds), the placement of just one additional "dummy element", acting as an auxiliary or reaction mass, does not lead to any appreciable increase in the structural expenditure.

Figure 14:
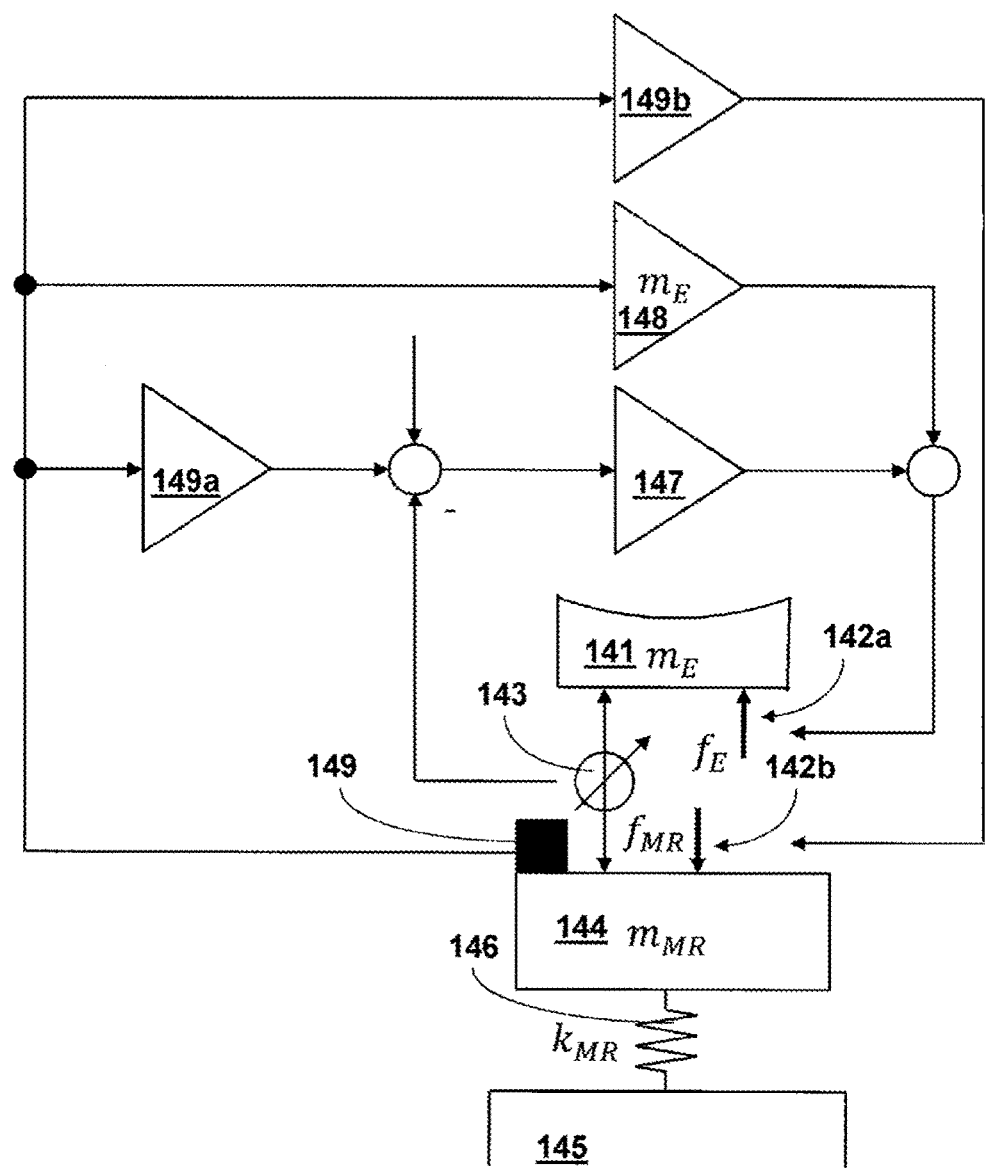

It goes without saying that the measures explained above with reference to the embodiments from FIG. 5 and FIG. 7 of an additional acceleration precontrol and an additional deformation compensation with regard to the attachment of the module frame can also be provided in conjunction with the use described above of two actuators. A corresponding arrangement is schematically represented in FIG. 14, components which are analogous or substantially functionally identical to FIG. 7 being denoted by reference numerals increased by "70". As a difference from the embodiment with only one actuator according to FIG. 7, an active damping is provided in the arrangement from FIG. 14 with two actuators 142a, 142b, the corresponding controller being indicated in the outer loop from FIG. 14 and denoted by "149b".

Even if, for reasons of a simpler and clearer representation, the illustrations and equations in the present application are indicated for a system with one translational degree of freedom, they can in each case be easily transferred to rotational movements and systems with more than one degree of freedom, in this case at least one sensor and at least one actuator being used for each degree of freedom. The position control circuit may be closed either by at least one single-variable controller (SISO system with one input and one output) for each manipulated degree of freedom or by one or more multi-variable controllers (MIMO). In the case of the configuration with (a) multi-variable controller(s), the sum of the number of inputs and the sum of the number of outputs of the multi-variable controllers used is greater than or equal to the number of manipulated degrees of freedom.

Figure 15:
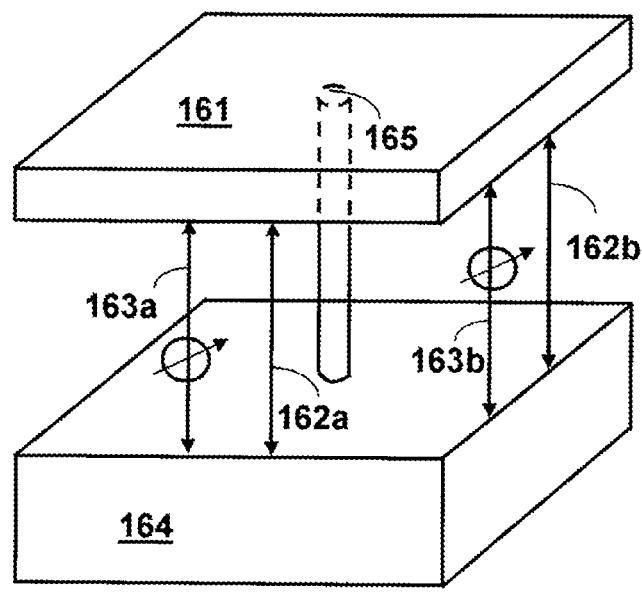
FIG. 15 shows a schematic representation of a further embodiment, in which a positional manipulation is performed in two degrees of freedom.
Figure 15:
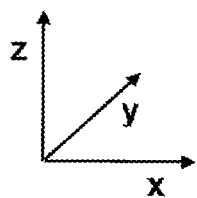

FIG. 15 shows an embodiment with two degrees of freedom of the positional manipulation, these being the rotational degrees of freedom $R_x$ (=rotation about the x axis) and $R_y$ (=rotation about the y axis). The element 161 to be positioned is mounted in a ball joint 165 with respect to a module frame 164, an actuator 162a and a sensor 163a being provided for the degree of freedom $R_x$ and a further actuator 162b and a further sensor 163b being provided for the degree of freedom $R_y$, the actuators 162a, 162b acting translationally in each case.

Figure 16:
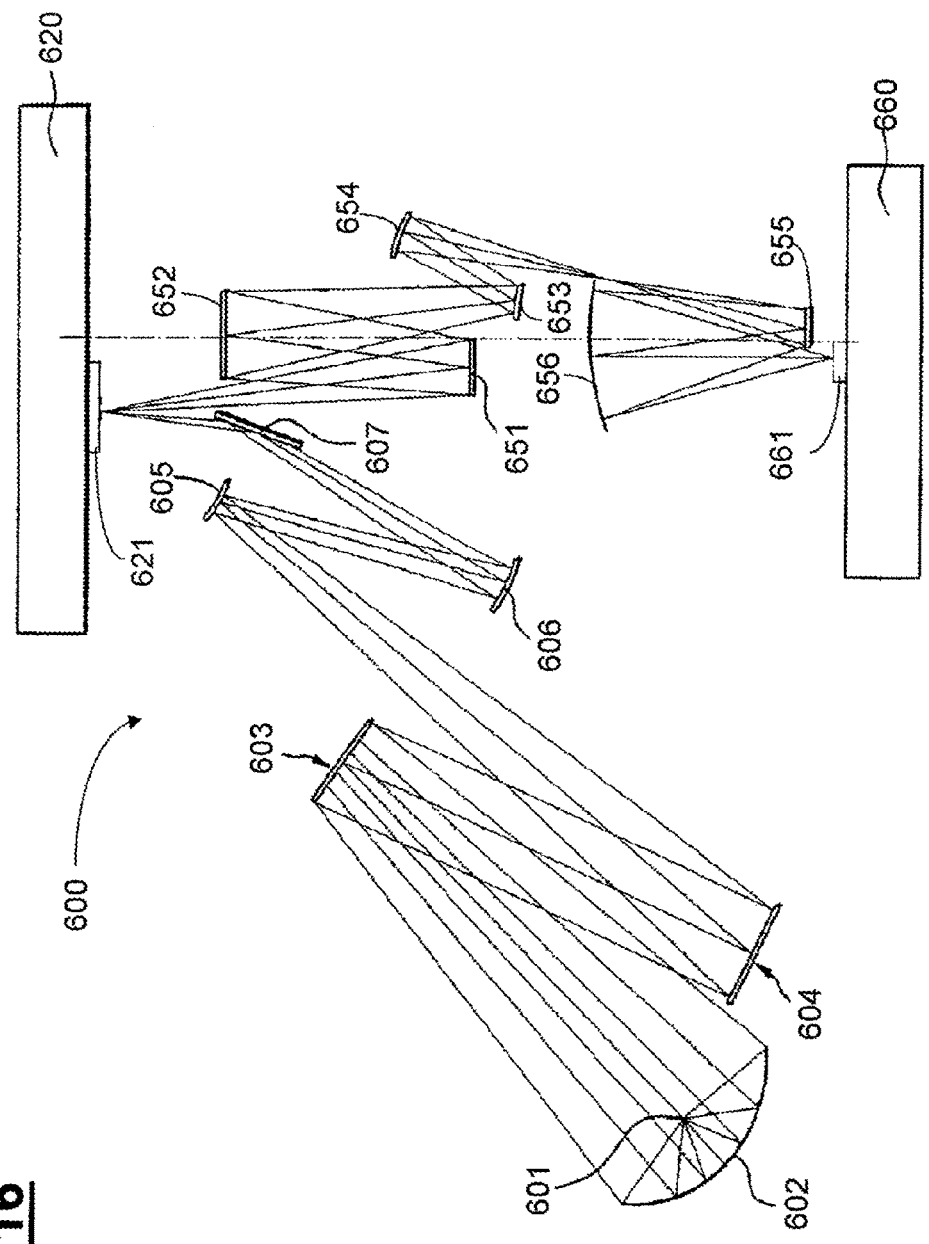
FIG. 16 shows a schematic representation of a lithographic projection exposure apparatus designed for operation in EUV.

FIG. 16 shows a schematic representation of a projection exposure apparatus which is designed by way of example for operation in EUV and in which the present disclosure can be realized.

According to FIG. 16, an illumination device in a projection exposure apparatus 600 designed for EUV includes a field facet mirror 603 and a pupil facet mirror 604. The light from a light source unit including a plasma light source 601 and a collector mirror 602 is directed onto the field facet mirror 603. A first telescope mirror 605 and a second telescope mirror 606 are arranged in the light path downstream of the pupil facet mirror 604. A deflection mirror 607 is arranged downstream in the light path, said deflection mirror directing the radiation that is incident on it onto an object field in the object plane of a projection lens including six mirrors 651-656. At the location of the object field, a reflective structure-bearing mask 621 is arranged on a mask stage 620, said mask being imaged with the aid of the projection lens into an image plane in which a substrate 661 coated with a light-sensitive layer (photoresist) is situated on a wafer stage 660.

Even though the disclosure has been described on the basis of specific embodiments, numerous variations and alternative embodiments are apparent to a person skilled in the art, for example by combination and/or exchange of features of individual embodiments. Accordingly, it goes without saying for a person skilled in the art that such variations and alternative embodiments are concomitantly encompassed by the present disclosure, and the scope of the disclosure is restricted only within the meaning of the accompanying patent claims and the equivalents thereof.

What is claimed is:

1. An arrangement configured to manipulate a position of an element in at least one degree of freedom, the arrangement comprising:
   for each degree of freedom of positional manipulation of the element, an actuator configured to exert adjustable forces on the element;
   for each degree of freedom of the positional manipulation of the element, a position sensor configured to generate in each case a sensor signal that is characteristic of the position of the element;
   a position controller which is configured to, in a position control circuit, control a force exerted on the element by the actuator depending on the sensor signal;
   a module frame; and
   a reference frame,
   wherein:
   at least one actuator and at least one position sensor are mounted on the module frame;
   the module frame is mechanically attached to the reference frame so that $0.5 \cdot \omega_B \leq \omega_{MR} \leq 2\omega_B$ for resonant frequencies $\omega_{MR}$ of the attachment; and
   $\omega_B$ denotes the bandwidth of the position control circuit.

2. The arrangement of claim 1, wherein the arrangement comprises precisely one actuator for each degree of freedom of the positional manipulation of the element.

3. The arrangement of claim 1, wherein the arrangement comprises at least two actuators for each degree of freedom of the positional manipulation of the element, and the arrangement is configured so that forces exerted on the element by the actuators are adjustable independently of one another.

4. The arrangement of claim 1, wherein the arrangement comprises:
   at least two actuators for each degree of freedom of the positional manipulation; and
   at least one position controller configured to control controls forces exerted by the actuators independently of one another in a position control circuit depending on the sensor signal, at least one of the actuators exerting a force on the element; and
   at least one of the actuators is assigned a further element with a reaction mass so that the force of reaction accompanying the force exerted on the element to be positioned by the actuator acts on the reaction mass.

5. The arrangement of claim 4, wherein the arrangement is configured so that a force of reaction accompanying the force that is exerted on the element or the module frame by at least one of the actuators is compensatable by another actuator of the at least two actuators.

6. The arrangement of claim 4, wherein the at least two actuators and the position sensor are mounted on the module frame.

7. The arrangement of claim 4, wherein the reaction mass is mechanically attached to the module frame.

8. The arrangement of claim 6, wherein the arrangement further comprises an acceleration precontrol configured to modify the force exerted on the element based on an acceleration of the reference frame.

9. The arrangement of claim 1, further comprising an acceleration sensor configured to measure an acceleration of the reference frame.

10. The arrangement of claim 9, wherein the acceleration sensor is mounted on the module frame.

11. The arrangement of claim 9, wherein the acceleration sensor is mounted on the reference frame.

12. The arrangement of claim 1, further comprising a deformation compensation controller configured to at least partially compensate a deformation of the mechanical attachment of the module frame to the reference frame.

13. The arrangement of claim 1, wherein:
the arrangement is configured to manipulate the position of the element in a plurality of degrees of freedom;
for each degree of freedom of the positional manipulation, the arrangement comprises at least one actuator configured to exert adjustable forces on the element; and
for each degree of freedom of the positional manipulation, the arrangement comprises at least one position sensor configured to generate a sensor signal characteristic of the position of the element.

14. The arrangement of claim 1, wherein the arrangement is configured to manipulate a position of a plurality of elements in at least one degree of freedom, and the plurality of elements are mounted together on the module frame.

15. The arrangement of claim 14, wherein the arrangement comprises, for a plurality of elements, a common additional actuator for each degree of freedom of the positional manipulation to compensate for forces of reaction.

16. The arrangement of claim 1, wherein the module frame comprises a mass that is no more than 10 times a mass of the element.

17. The arrangement of claim 1, wherein the element is a mirror.

18. The arrangement of claim 1, wherein the element is a mirror facet of a facet mirror which comprises a plurality of mirror facets.

19. The arrangement of claim 1, wherein the system is an optical system of a projection exposure apparatus.

20. An apparatus, comprising:
the arrangement of claim 1,
wherein the apparatus is a projection exposure apparatus.

21. The apparatus of claim 20, wherein the apparatus is an EUV projection exposure apparatus.

* * * * *